United States Patent
Mullady

(10) Patent No.: US 10,080,310 B2
(45) Date of Patent: Sep. 18, 2018

(54) BYPASSING A REMOVED ELEMENT IN A LIQUID COOLING SYSTEM

(71) Applicant: International Business Machines Corporation, Armonk, NY (US)

(72) Inventor: Robert K. Mullady, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 324 days.

(21) Appl. No.: 14/751,287

(22) Filed: Jun. 26, 2015

(65) Prior Publication Data
US 2016/0377358 A1    Dec. 29, 2016

(51) Int. Cl.
| G05D 23/19 | (2006.01) |
| H05K 7/20 | (2006.01) |
| G06F 1/20 | (2006.01) |
| F28D 15/00 | (2006.01) |

(52) U.S. Cl.
CPC ......... *H05K 7/20281* (2013.01); *F28D 15/00* (2013.01); *G06F 1/20* (2013.01); *F28F 2250/06* (2013.01); *G06F 2200/201* (2013.01)

(58) Field of Classification Search
CPC ....... H05K 7/20281; F28D 15/00; G06F 1/20; G06F 2200/20; F28F 2250/06
See application file for complete search history.

(56) References Cited

U.S. PATENT DOCUMENTS

| 4,491,208 A | 1/1985 | Burdon, Jr. |
| 4,503,673 A | 3/1985 | Schachle et al. |
| 4,973,080 A | 11/1990 | Ikemoto et al. |
| 4,986,383 A | 1/1991 | Evans |
| 5,004,008 A | 4/1991 | Drucker |
| 5,013,062 A | 5/1991 | Yonekawa et al. |
| 5,025,640 A | 6/1991 | Drucker |
| 5,042,834 A | 8/1991 | Yonekawa et al. |
| 5,043,893 A | 8/1991 | Aburaya et al. |
| 5,057,342 A | 10/1991 | Hoy et al. |
| 5,066,522 A | 11/1991 | Cole et al. |
| 5,069,475 A | 12/1991 | Yonekawa et al. |
| 5,071,158 A | 12/1991 | Yonekawa et al. |
| 5,103,397 A | 4/1992 | Ikemoto et al. |
| 5,104,143 A | 4/1992 | Yonekawa |

(Continued)

FOREIGN PATENT DOCUMENTS

| JP | 08219615 A | 8/1996 |
| JP | 2004-205160 A | 7/2004 |

OTHER PUBLICATIONS

U.S. Appl. No. 15/099,799, filed Apr. 15, 2016, Entitled "Bypassing a Removed Element in a Liquid Cooling System".

(Continued)

*Primary Examiner* — Ljiljana Ciric
(74) *Attorney, Agent, or Firm* — Edward J. Wixtred, III

(57) ABSTRACT

A source of liquid provided an input of liquid into a liquid cooling system. The liquid from the source of liquid flows through a check valve assembly which includes an input, a first output, and a second output. The second output includes a check valve configured to open when the pressure of the liquid exceeds a threshold pressure value. A connector is attached to the first output of the check valve assembly. The connector is a quick connect fitting equipped with a self-sealing valve.

4 Claims, 5 Drawing Sheets

(56) References Cited

U.S. PATENT DOCUMENTS

| | | | |
|---|---|---|---|
| 5,119,297 A | 6/1992 | Buma et al. | |
| 5,141,156 A | 8/1992 | Hoy et al. | |
| 5,162,995 A | 11/1992 | Ikemoto et al. | |
| 5,170,638 A | 12/1992 | Koenig et al. | |
| 5,177,681 A | 1/1993 | Sato | |
| 5,203,843 A | 4/1993 | Hoy et al. | |
| 5,304,390 A | 4/1994 | Condron et al. | |
| 5,535,818 A | 7/1996 | Fujisaki et al. | |
| 5,607,027 A | 3/1997 | Puett, Jr. | |
| 5,661,987 A | 9/1997 | Zarate | |
| 5,700,226 A | 12/1997 | Droste | |
| 5,762,134 A | 6/1998 | Droste et al. | |
| 5,890,509 A | 4/1999 | Becker et al. | |
| 6,354,342 B1 | 3/2002 | Gagliano | |
| 6,769,252 B2 | 8/2004 | Smith | |
| 7,086,247 B2 | 8/2006 | Campbell et al. | |
| 7,088,585 B2 | 8/2006 | Chu et al. | |
| 7,927,482 B1 | 4/2011 | Luke et al. | |
| 9,328,575 B2 | 5/2016 | Feasey et al. | |
| 9,629,281 B2 * | 4/2017 | Mullady | H05K 7/20281 |
| 2002/0104800 A1 | 8/2002 | Collins et al. | |
| 2003/0115893 A1 | 6/2003 | Flynn et al. | |
| 2004/0008483 A1 * | 1/2004 | Cheon | G06F 1/20 |
| | | | 361/679.53 |
| 2005/0034710 A1 | 2/2005 | Crary et al. | |
| 2005/0056661 A1 | 3/2005 | Casamatta et al. | |
| 2005/0139552 A1 | 6/2005 | Forsberg et al. | |
| 2006/0000207 A1 | 1/2006 | Rush | |
| 2006/0054404 A1 | 3/2006 | El-Ibiary | |
| 2006/0168976 A1 | 8/2006 | Flynn et al. | |
| 2007/0202367 A1 | 8/2007 | Yoshida | |
| 2008/0066466 A1 | 3/2008 | Melchior | |
| 2009/0009958 A1 | 1/2009 | Pflueger | |
| 2009/0044788 A1 | 2/2009 | Shutty et al. | |
| 2009/0071636 A1 | 3/2009 | Novotny | |
| 2009/0255598 A1 | 10/2009 | Krug, Jr. et al. | |
| 2010/0287924 A1 | 11/2010 | Dostal et al. | |
| 2011/0061744 A1 | 3/2011 | Zillig et al. | |
| 2011/0063792 A1 * | 3/2011 | Schmidt | G06F 1/20 |
| | | | 361/679.46 |
| 2011/0138807 A1 | 6/2011 | Ulrey et al. | |
| 2011/0307157 A1 | 12/2011 | Pursifull | |
| 2012/0145502 A1 | 6/2012 | Moorman et al. | |
| 2012/0145504 A1 | 6/2012 | Moorman et al. | |
| 2012/0191037 A1 * | 7/2012 | Patel | F16K 5/0407 |
| | | | 604/30 |
| 2012/0280175 A1 | 11/2012 | Kania et al. | |
| 2012/0297772 A1 | 11/2012 | McBride et al. | |
| 2013/0020237 A1 | 1/2013 | Wilt et al. | |
| 2013/0126430 A1 * | 5/2013 | Kenley | B01D 61/00 |
| | | | 210/638 |
| 2013/0152572 A1 | 6/2013 | Madderno et al. | |
| 2013/0277011 A1 | 10/2013 | Jainek | |
| 2013/0340455 A1 | 12/2013 | Martin et al. | |
| 2014/0090408 A1 | 4/2014 | Norrell et al. | |
| 2014/0100080 A1 | 4/2014 | Ruona et al. | |
| 2014/0124190 A1 * | 5/2014 | Campbell | H05K 7/20281 |
| | | | 165/296 |
| 2015/0029658 A1 * | 1/2015 | Yairi | G06F 1/20 |
| | | | 361/679.47 |
| 2015/0208549 A1 * | 7/2015 | Shedd | H05K 7/20327 |
| | | | 165/104.27 |
| 2016/0061508 A1 | 3/2016 | Lowrimore et al. | |
| 2016/0116224 A1 * | 4/2016 | Shedd | F25B 41/003 |
| | | | 165/104.22 |

OTHER PUBLICATIONS

List of IBM Patents or Patent Applications Treated as Related, Dated Apr. 15, 2016, 2 pages.

* cited by examiner

BYPASSING A REMOVED ELEMENT IN A LIQUID COOLING SYSTEM

BACKGROUND

The present invention relates generally to the field of liquid cooling systems and more particularly to the process of bypassing a removed component in a liquid cooling system.

Liquid cooling systems are commonly utilized to cool electronic components such as computer processors and memory during operation. In liquid cooling systems, an input of cold liquid is passed over hot components to dissipate the heat from the components into the cold liquid. The transfer of heat from the hot components into the cold liquid causes the temperature of the liquid to rise, and the liquid must be cooled before the liquid can be utilized again to cool components. Heat exchangers are often utilized to cool the liquid back down before it can be used to cool components again. Heat exchangers allow for some of the heat of the liquid to be dissipated into a secondary medium such as another liquid or air. Due to the higher specific heats of common liquids such as water, liquid cooling systems perform more effectively and with greater efficiency than air-based cooling systems.

SUMMARY

Embodiments of the invention disclose a system for bypassing a component in a liquid cooling system. A source of liquid provided an input of liquid into a liquid cooling system. The liquid from the source of liquid flows through a check valve assembly which includes an input, a first output, and a second output. The second output includes a check valve configured to open when the pressure of the liquid exceeds a threshold pressure value. A connector is attached to the first output of the check valve assembly. The connector is a quick connect fitting equipped with a self-sealing valve.

DETAILED DESCRIPTION

In general, embodiments of the present invention provide a method of bypassing an element included within a liquid cooling system. In liquid cooling systems, it is desirable to be able to bypass an element such that the element can be removed without liquid leaking out of the system and damaging any other parts or elements through contact with liquids.

In various embodiments, the element which is bypassed can be either a part which is to be cooled, such as a central processing unit (CPU), a graphics processing unit (GPU), a field-programmable gate array (FPGA), a power supply, random access memory (RAM), or any other part of a computing device which is to be cooled using a liquid cooling system. In other embodiments, an element which is bypassed can be a component such as a pump, a heat exchanger, a valve, or any other component which is included in a liquid cooling system.

Figure 1:
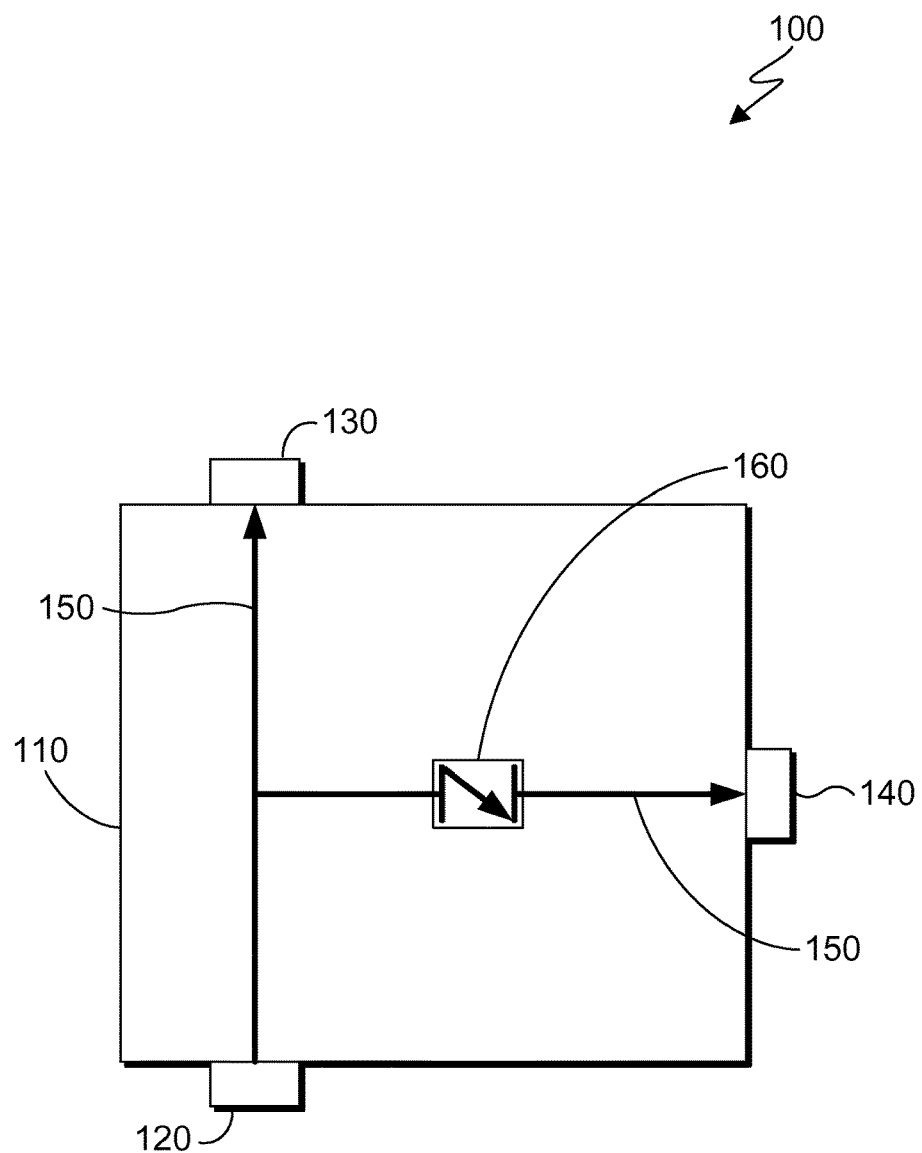
FIG. 1 is a block diagram depicting the components included within a check valve assembly, in accordance with an embodiment of the invention.

The present invention will now be described in detail with reference to the Figures. FIG. 1 is a functional block diagram illustrating a check valve assembly, generally designated 100, in accordance with an embodiment of the invention. In general, check valve assembly 100 automatically diverts the flow of liquid from exiting primary output 130 to exiting secondary output 140 when a device connected to primary output 130 is removed and an increase in the pressure of the cooling liquid occurs. In the depicted embodiment, check valve assembly 100 includes assembly body 110, input 120, primary output 130, secondary output 140, internal piping 150, and check valve 160.

Assembly body 110 is a body which encases the other components of check valve assembly 100 depicted in FIG. 1, in accordance with an embodiment of the invention. In various embodiments, assembly body 110 can be composed of plastic, metal, or any other material capable of containing the other components included within check valve assembly 100. In a preferred embodiment, assembly body 110 is sealed and waterproof such that in the event that a leak develops within check valve assembly 100, none of the liquid would be able to escape from within assembly body 110. In other embodiments, such as embodiments where decreasing the size of check valve assembly 100 is of interest, no assembly body such as assembly body 110 is included in check valve assembly 100.

Input 120 is an interface through which liquid enters check valve assembly 100, in accordance with an embodiment of the invention. In some embodiments, input 120 is a quick-connect which allows for check valve assembly 100 to receive a flow of liquid as an input. In other embodiments, input 120 is a pipe connection from an external component which is soldered, glued, or fastened onto a terminal present within assembly body 110 or the end of a portion of internal piping such as internal piping 150.

In embodiments where input 120 is a quick-connect, the quick-connect is configured to allow for liquid cooling components such a heat exchanger, a device to be cooled, or a check valve assembly to be easily added and removed from a liquid cooling system. In various embodiments, the quick connects are configured to stop the flow of liquid when the liquid cooling component is removed. For example, in an embodiment where input 120 is a quick-connect, the removal of check valve assembly 100 results in the flow of liquid into check valve assembly 100 being stopped. In general, in embodiments where the removal of a liquid cooling component results in the flow of liquid through the quick connect being stopped, the quick-connect includes a self-sealing valve which is configured to only allow the flow of liquid if a component is attached to the quick-connect.

Primary output 130 is the primary output of check valve assembly 100, and is the output which connects to the next sequential component to receive the output flow from check valve assembly 100 under normal operating circumstances.

In general, when the pressure within internal piping 150 remains relatively low and check valve 160 is closed, the liquid output from check valve assembly 100 exits from primary output 130. In the depicted embodiment, primary output 130 is depicted as being located directly opposite from input 120. It should be appreciated that the invention is not limited to embodiments where primary output 130 is located directly opposite from input 120, and that in other embodiments primary output 130 can be located anywhere within assembly body 110 or relative to input 120.

Secondary output 140 is the secondary output of check valve assembly 100, and is the output which connects to a portion of piping used to bypass a component of a liquid cooling system. In various embodiments, the flow of liquid from check valve assembly 100 exits through secondary output 140 when the pressure within internal piping 150 reaches a threshold which causes check valve 160 to open. In these embodiments, secondary output 140 is the output which liquid can only reach by flowing through check valve 160.

Internal piping 150 is a portion of piping used to connect the various components included within check valve assembly 100, in accordance with an embodiment of the invention. In some embodiments, internal piping 150 can be composed of a metal material such as zinc, copper, or stainless steel. In other embodiments, internal piping 150 is composed of a plastic material such as polyvinyl chloride (PVC). In general, any material known in the art to be suitable for forming a pipe can be used in embodiments of the invention. In a preferred embodiment, internal piping 150 has a cross-sectional shape which is circular. However, in other embodiments, internal piping 150 can have any cross sectional area such that the design of internal piping 150 facilitates the flow of liquid between two elements included in check valve assembly 100.

Check valve 160 is a valve which is configured to open and allow the flow of liquid through check valve 160 when the pressure applied to the valve reaches a threshold value. For example, in an embodiment where check valve 160 has a threshold value of 200,000 pascals (Pa), a pressure of 190,000 Pa applied to check valve 160 does not result in check valve 160 opening while a pressure of 210,000 Pa applied to check valve 160 results in check valve 160 opening and allowing liquid to flow through. In a preferred embodiment, check valve 160 is a normally-closed check valve, which only opens in the event that the pressure applied to the input terminal of check valve 160 meets or exceeds the threshold value. In various embodiments, any type of check valve known in the art, such as a ball check valve or a tilting disc check valve, can be used to form check valve 160.

In general, check valve 160 only permits liquid to flow in one direction, which is indicated by the arrow depicted within check valve 160. While the application of a pressure greater than the threshold value allows for liquid to flow in the direction indicated by the arrow, no amount of pressure applied to check valve 160 results in the flow of liquid in the direction opposite that indicated by the arrow within check valve 160.

Figure 2:
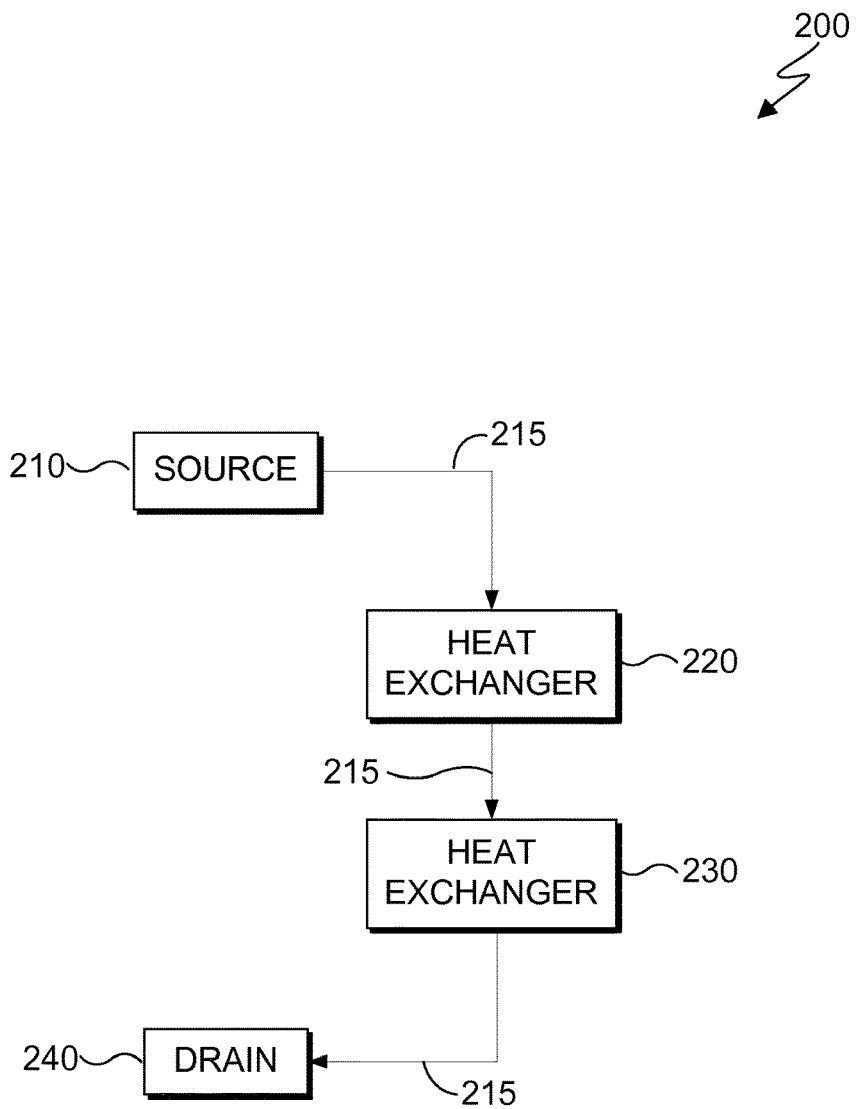
FIG. 2 is a block diagram depicting a liquid cooling system which includes two liquid cooling components connected in series.

FIG. 2 illustrates a liquid cooling environment 200, including two heat exchangers connected in series, which are utilized for dissipating heat from a liquid cooling system. The cooling system depicted in FIG. 2 includes Source 210, external piping 215, heat exchangers 220 and 230, and drain 240. In general, liquid is intended to flow through the system depicted in FIG. 2 from source 210 to drain 240 (as illustrated by the arrowheads of external piping 215).

Source 210 is a source from which liquid flows before it enters heat exchangers 220 and 230. In one embodiment, source 210 is a connection which carries the hot output liquid from a liquid cooling system. In this embodiment, the liquid which is output by source 210 may have passed over electronic components such as CPUs or GPUs and may have increased in temperature before entering the liquid cooling environment depicted in FIG. 2.

External piping 215 are portions of piping which are used to contain the flow of liquid between the various components depicted in FIG. 2. In some embodiments, external piping 215 can be composed of a metal material such as zinc, copper, or stainless steel. In other embodiments, external piping 215 is composed of a plastic material such as polyvinyl chloride (PVC). In general, any material known in the art to be suitable for forming a pipe can be used in embodiments of the invention. In a preferred embodiment, external piping 215 has cross-sectional shapes which are circular. However, in other embodiments, external piping 215 can have any cross sectional area such that the design of external piping 215 facilitates the flow of liquid between two components.

It should be appreciated that quick connects may be utilized to connect any portions of internal piping such as external piping 215 to other components or devices.

Heat exchangers 220 and 230 are devices which transfer thermal energy from one medium to another. In the depicted embodiment, heat exchangers 220 and 230 transfer heat from the liquid which is received from source 210, herein referred to as "the hot liquid", into a secondary flow of liquid (not shown), which has a temperature lower than that of the flow of liquid which is received from source 210. In many embodiments, heat exchangers 220 and 230 operate by breaking the flow of the hot liquid into many smaller pipes, all of which are enclosed in a tank. Once the flow of the hot liquid is split up into smaller pipes, the secondary flow of liquid is diverted into the body of the tank such that the secondary liquid flows through the tank and around the smaller pipes to which the flow of the hot liquid has been diverted. In this design, the higher surface area created by the larger number of smaller pipes results in greater cooling speed of the hot liquid, and a greater transfer of thermal energy between the hot liquid and the secondary flow of liquid.

In general, heat exchangers 220 and 230 can be any devices which facilitate transferring a portion of the thermal energy included in the flow of liquid received from source 210 into a secondary medium such as a secondary flow of liquid. In a preferred embodiment, thermal energy is transferred from the flow of liquid received from source 210 into the secondary medium without direct contact between the liquid received from source 210 and the secondary medium. In other embodiments, the secondary medium used by heat exchangers 220 and 230 is air.

Drain 240 is a connection or portion of piping which the output of heat exchangers 220 and 230 flow into after being cooled by heat exchangers 220 and 230, in accordance with an embodiment of the invention. In one embodiment, drain 240 is a portion of piping which carries the cooled output of heat exchangers 220 and 230 back to a liquid cooling system to be used for cooling a computing component.

In general, connecting components such as heat exchangers 220 and 230 in series in a liquid cooling system facilitates the cooling system operating with greater efficiency than connecting the components in parallel. The greater efficiency achieved by connecting components in series as opposed to in parallel arises from the advantage of having all of the liquid in the liquid cooling system flow through both devices, as opposed to having only a portion of the liquid flow through each device in an embodiment where components are connected in parallel. An example of components connected in parallel is depicted and described in greater detail with respect to FIG. 3.

It should be appreciated that although FIG. 2 depicts two heat exchangers being connected in series, any components of a liquid cooling system such as parts which are to be cooled including CPUs, GPUs, power supplies, or RAM can be connected in series as depicted in FIG. 2 in order to increase the efficiency of the liquid cooling system. In other embodiments, any other liquid cooling system components such as pumps or valves can be connected in series similarly to heat exchangers 220 and 230.

Figure 3:
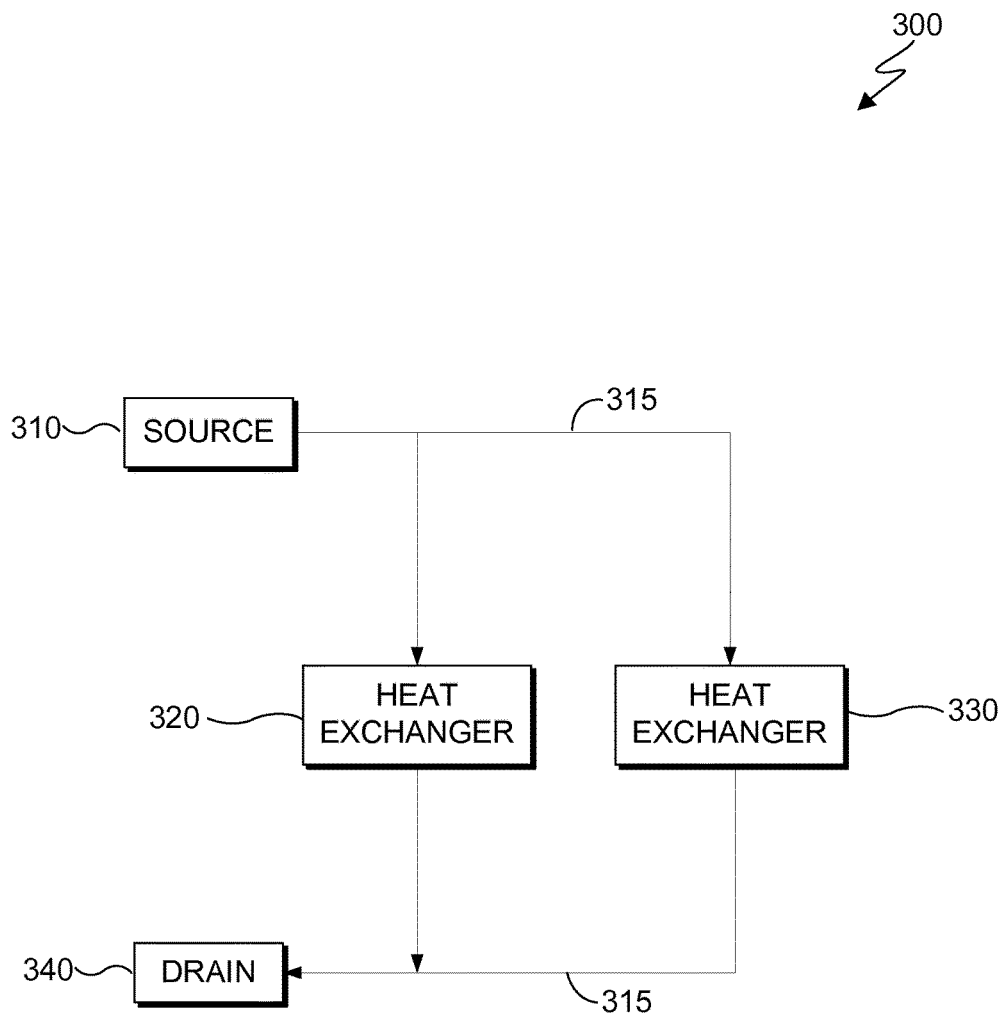
FIG. 3 is a block diagram depicting a liquid cooling system which includes two liquid cooling components connected in parallel.

FIG. 3 illustrates a liquid cooling environment, generally designated 300, which includes two heat exchangers connected in parallel which are utilized for dissipating heat from a liquid cooling system. The cooling system depicted in FIG. 3 includes Source 310, external piping 315, heat exchangers 320 and 330, and drain 340. In general, liquid is intended to flow through the system depicted in FIG. 3 from source 310 to drain 340 (as illustrated by the arrowheads of external piping 315).

Source 310 is a source from which liquid flows before it enters heat exchangers 320 and 330. In general, source 310 is substantially similar to source 210 depicted and described in greater detail with respect to FIG. 2.

External piping 315 is portions of piping which are used to contain the flow of liquid between the various components depicted in FIG. 3. In general, external piping 315 is substantially similar to external piping 215 depicted and described in greater detail with respect to FIG. 2.

Heat exchangers 320 and 330 are devices which transfer thermal energy from the liquid which is received from source 310 into a secondary medium such as liquid or air (not shown), in accordance with an embodiment of the invention. In general, heat exchangers 320 and 330 are substantially similar to heat exchangers 220 and 230 depicted and described in greater detail with respect to FIG. 2.

Drain 340 is a connection or portion of piping which the output of heat exchangers 320 and 330 flow into after being cooled by heat exchangers 320 and 330, in accordance with an embodiment of the invention. In general, drain 340 is substantially similar to drain 240 illustrated and described in greater detail with respect to FIG. 2.

In general, FIG. 3 depicts an exemplary liquid cooling system where two liquid cooling components are connected in parallel. In various embodiments, connecting liquid cooling components in parallel is desirable if there is a significant chance that a liquid cooling component will be removed at some point. As opposed to a system where liquid cooling components are connected in series, a system where liquid cooling components are connected in parallel can function when one of the liquid cooling components is removed. In embodiments where the performance of the liquid cooling system is of particular importance, connecting components in series is preferred to connecting components in parallel due to the increased performance of in-series components which results from having all of the liquid in the liquid cooling system flow through each component.

Figure 4:
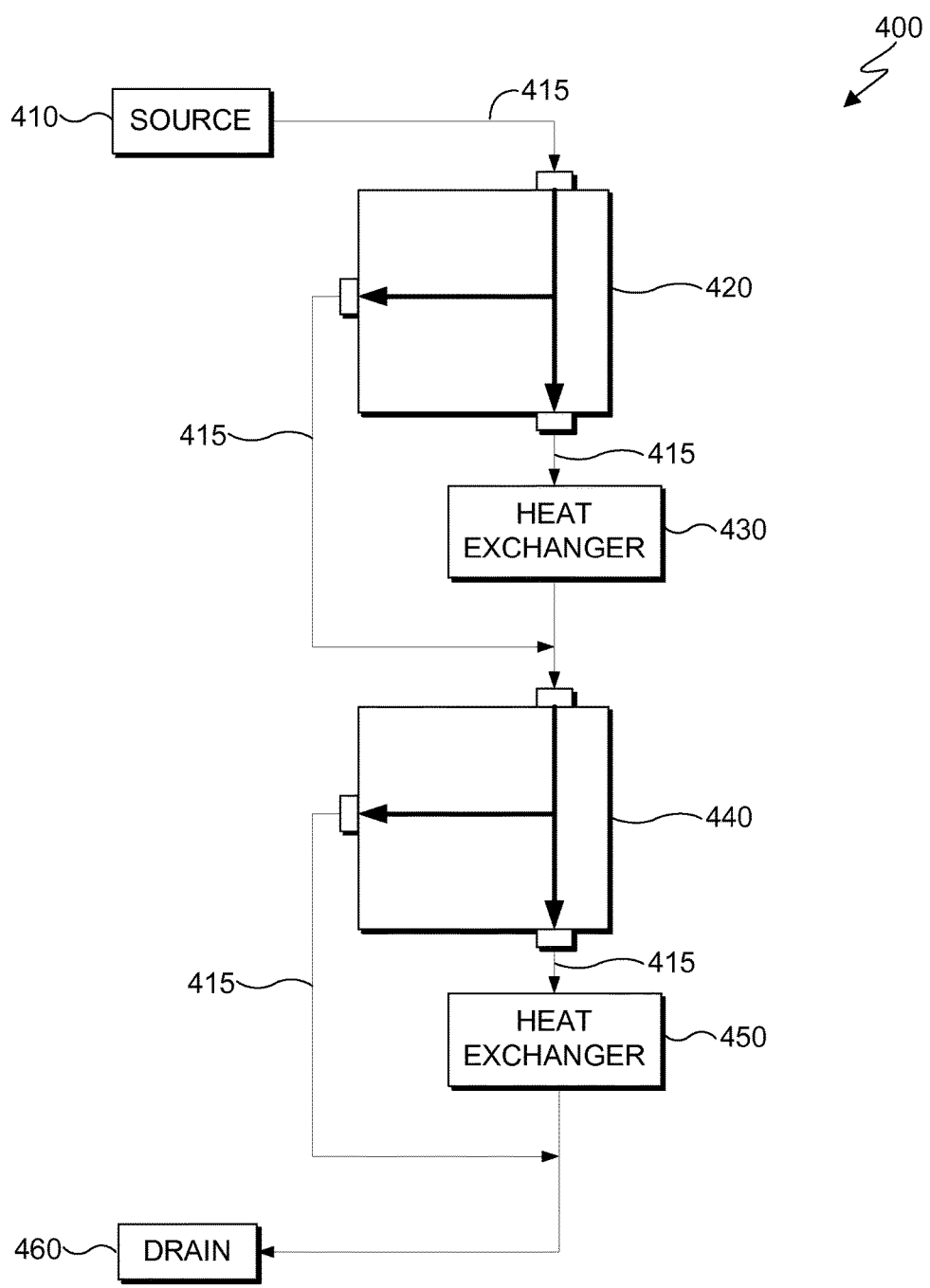
FIG. 4 is a block diagram which depicts a liquid cooling system which includes two liquid cooling components connected in series, along with two check valve assemblies of FIG. 1.

FIG. 4 illustrates a liquid cooling system, generally designated 400, which includes two heat exchangers connected in series with check valve assemblies, in accordance with an embodiment of the invention. Liquid cooling system 400 of FIG. 4 includes source 410, external piping 415, check valve assemblies 420 and 440, heat exchangers 430 and 450, and drain 460.

Source 410 is a source from which liquid flows before it enters heat exchangers 420 and 440. In general, source 410 is substantially similar to source 210 depicted and described in greater detail with respect to FIG. 2.

External piping 415 are portions of piping which are used to contain the flow of liquid between the various components depicted in FIG. 3. In general, external piping 415 is substantially similar to external piping 215 depicted and described in greater detail with respect to FIG. 2.

Check valve assemblies 420 and 440 are components which, in the event that a component is removed from a liquid cooling system, facilitate diverting the flow of liquid around the missing component. In general, check valve assemblies 420 and 440 are substantially similar to check valve assembly 100 depicted and described in greater detail with respect to FIG. 1.

Heat exchangers 430 and 450 are devices which transfer thermal energy from the liquid which is received from source 410 into a secondary medium such as liquid or air (not shown), in accordance with an embodiment of the invention. In general, heat exchangers 430 and 450 are substantially similar to heat exchangers 220 and 230 depicted and described in greater detail with respect to FIG. 2.

Drain 460 is a connection or portion of piping which the output of heat exchangers 430 and 450 flow into after being cooled by heat exchangers 430 and 450, in accordance with an embodiment of the invention. In general, drain 460 is substantially similar to drain 240 illustrated and described in greater detail with respect to FIG. 2.

In some embodiments, check valve assembly 440 is configured to divert liquid (i.e., open the check valve of check valve assembly 440) at a lower pressure value than check valve assembly 420. In general, as check valve assembly is further away from source 410, the pressure required for check valve assemblies 440 to divert liquid is less than the pressure for check valve assembly 420 to divert liquid to ensure that both check valves do not open in embodiments, such as the embodiment depicted in FIG. 5, where heat exchanger 450 is removed.

Figure 5:
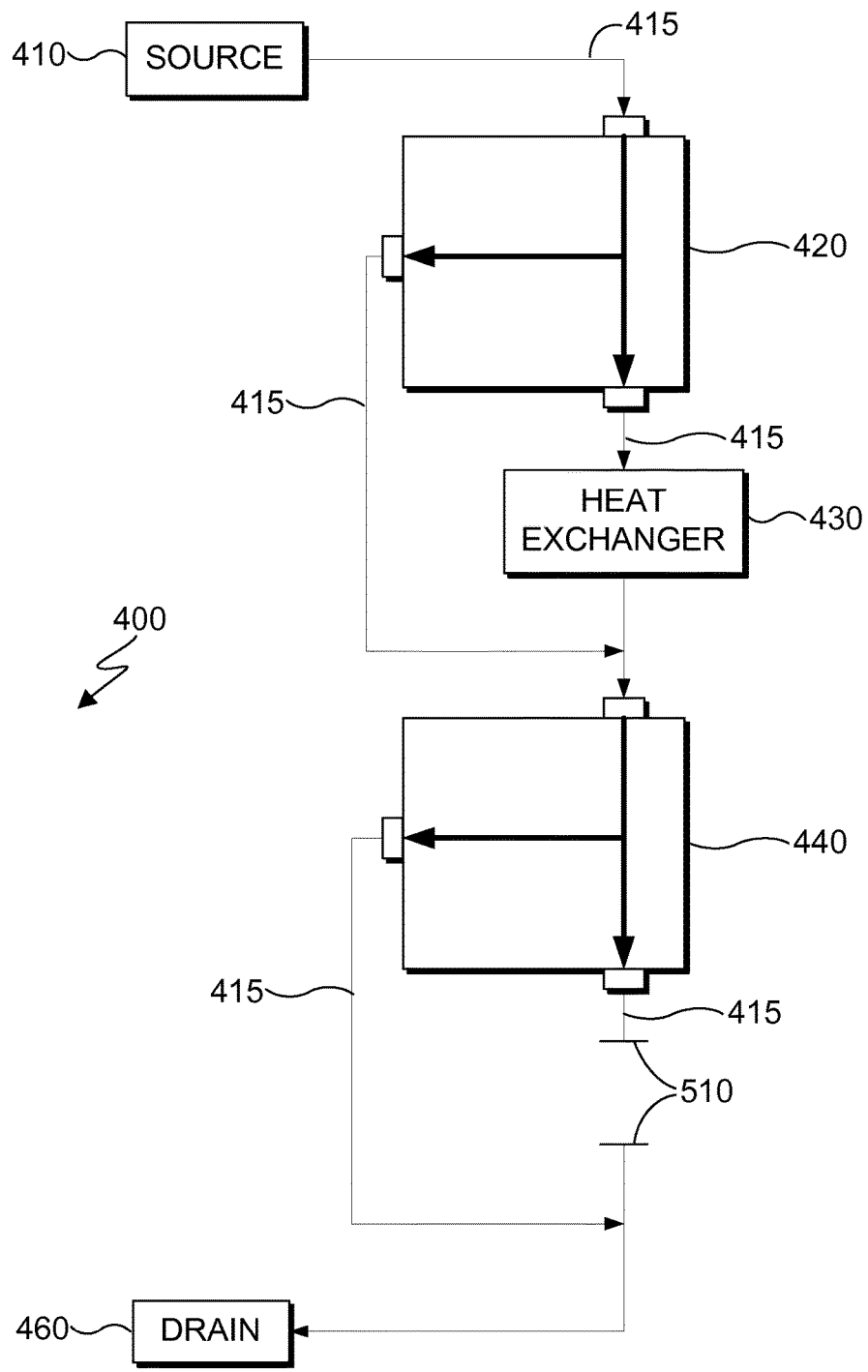
FIG. 5 depicts the liquid cooling system of FIG. 4 after one of the liquid cooling components has been removed, and the flow of liquid is diverted around the removed component by one of the check valve assemblies.

FIG. 5 illustrates the liquid cooling system 400 of FIG. 4 after heat exchanger 450 has been removed, in accordance with an embodiment of the invention.

Quick connects 510 are connectors which are configured to allow for liquid cooling system components such as heat exchanger 450 to be easily added and removed from a liquid cooling system. In various embodiments, quick connects 510 are configured to stop the flow of liquid when heat exchanger 450 is removed. For example, in the embodiment depicted in FIG. 5, heat exchanger 450 has been removed, and as a result, both quick connects 510 are closed and do not allow liquid to flow out of the ends of internal piping 415.

As a result of the closure of quick connects 510, liquid is no longer able to flow from source 410 to drain 460, and hydrostatic pressure builds up in the system. It should be appreciated that the amount of hydrostatic pressure which builds up in the system is determined by the properties of source 410 or another device such as a liquid pump which controls how liquid enters liquid cooling environment 400.

The buildup of hydrostatic pressure within external piping 415 causes the check valve within check valve assembly 440 to open, allowing liquid to bypass the component removed from quick connects 510.

In this embodiment, it is desirable that the pressure which is required for the check valve within check valve assembly 440 to open be configured to at a lower pressure than the check valve within check valve assembly 420. In embodiments which include multiple check valve assemblies connected in series, it is desirable that the pressure required to open each successive check valve decreases, with respect to the direction of the flow of liquid within the liquid cooling system.

In general, when a component such as a heat exchanger is removed from liquid cooling system 400, hydrostatic pressure builds uniformly up in the system within the region between source 410 and the first quick connect 510 adjacent to the removed component. As a result, it is desirable that the check valve within the check valve assembly nearest to the removed component open first, and allow for the pressure to be reduced to avoid all of the check vales opening and bypassing other liquid cooling components which have not been removed. For example, in the embodiment depicted in FIG. 5, it is desirable that if a liquid cooling component is removed from quick connects 510, then the check valve included within check valve assembly 440 opens while the check valve within check valve assembly 420 does not open.

What is claimed is:

1. A system for bypassing a component in a liquid cooling system, the system comprising:
   a source of liquid, wherein:
      the source of liquid comprises an input of liquid pressurized at a first pressure; and
      the first pressure is greater than a threshold pressure value;
   a check valve assembly comprising an input, a first output, and a second output, wherein the second output includes a check valve configured to open responsive to the pressure of the liquid exceeding the threshold pressure value; and
   a connector attached to the first output of the check valve assembly, wherein the connector is a quick connect fitting equipped with a self-sealing valve.

2. The system of claim 1, wherein the connector is operably compatible with an input to a liquid cooling component.

3. The system of claim 1, further comprising:
   one or more pipes connecting the source of liquid to the input of the check valve assembly; and
   one or more pipes connecting the first output to an input to a liquid cooling component.

4. The system of claim 3, further comprising one or more pipes connecting the second output to a destination that bypasses the liquid cooling component.

* * * * *